US012658247B2

(12) United States Patent (10) Patent No.: US 12,658,247 B2

Sisodia et al. (45) Date of Patent: Jun. 16, 2026

(54) RAPID POWER READY SIGNALING IN A MEMORY ARRAY

(71) Applicant: Arm Limited, Cambridge (GB)

(72) Inventors: Rajiv Kumar Sisodia, Bangalore (IN); Disha Singh, Bangalore (IN); Andy Wangkun Chen, Austin, TX (US); Santhoshnaik Haleshnaik, Bangalore (IN)

(73) Assignee: Arm Limited, Cambridge (GB)

( * ) Notice: Subject to any disclaimer, the term of this patent is extended or adjusted under 35 U.S.C. 154(b) by 32 days.

(21) Appl. No.: 18/680,911

(22) Filed: May 31, 2024

(65) Prior Publication Data

US 2025/0372157 A1 Dec. 4, 2025

(51) Int. Cl.
G11C 11/417 (2006.01)
G11C 5/14 (2006.01)
G11C 11/4074 (2006.01)

(52) U.S. Cl.
CPC ............ G11C 11/417 (2013.01); G11C 5/147 (2013.01); G11C 5/148 (2013.01); *G11C 11/4074* (2013.01)

(58) Field of Classification Search
CPC ....... G11C 11/417; G11C 5/147; G11C 5/148; G11C 7/1003
USPC ....................................................... 365/226
See application file for complete search history.

(56) References Cited

U.S. PATENT DOCUMENTS

| | | | | | |
|---|---|---|---|---|---|
| 4,578,774 | A | * | 3/1986 | Muller | ................... G11C 16/20 713/324 |
| 5,828,592 | A | * | 10/1998 | Tran | ..................... G11C 27/005 365/45 |
| 8,947,968 | B2 | * | 2/2015 | Chen | ...................... G11C 5/148 365/203 |
| 9,343,117 | B1 | | 5/2016 | Lee | |
| 11,545,192 | B2 | | 1/2023 | Wan | |
| 11,776,587 | B2 | | 10/2023 | Chang | |
| 2005/0254322 | A1 | * | 11/2005 | Yamada | ............... G11C 29/842 365/200 |
| 2014/0192583 | A1 | | 7/2014 | Rajan | |
| 2015/0009772 | A1 | | 1/2015 | Chen | |
| 2015/0149825 | A1 | * | 5/2015 | Lucas | ................. G06F 11/1402 714/22 |
| 2015/0170716 | A1 | * | 6/2015 | Lucas | .................... G11C 5/147 365/226 |
| 2016/0306412 | A1 | | 10/2016 | Kolla | |

(Continued)

OTHER PUBLICATIONS

Notice of Allowance, U.S. Appl. No. 18/427,637, Mailed Aug. 20, 2025, 9 pages.

(Continued)

*Primary Examiner* — Ly D Pham

(74) *Attorney, Agent, or Firm* — Berkeley Law & Technology Group, LLP

(57) ABSTRACT

A first memory instance comprises one or more first bitcell arrays and one or more peripheral circuits. The first memory instance further comprises a high-speed voltage monitoring circuit operable to monitor a supply voltage and a power down signal in the first memory instance, the high-speed voltage monitoring circuit further operable to provide an output power ready signal derived from the supply voltage and the power down signal such that the output power ready signal indicates when the power down signal is low and the supply voltage is high.

20 Claims, 9 Drawing Sheets

(56) References Cited

U.S. PATENT DOCUMENTS

| | | | | |
|---|---|---|---|---|
| 2019/0392918 | A1* | 12/2019 | Cariello | ................. G11C 29/52 |
| 2020/0242027 | A1* | 7/2020 | Park | ..................... G06F 3/0614 |
| 2020/0381042 | A1* | 12/2020 | Pilo | ......................... G11C 7/12 |
| 2020/0402570 | A1 | 12/2020 | Goel | |
| 2021/0004030 | A1* | 1/2021 | Chang | .................... H03K 3/037 |
| 2022/0155840 | A1* | 5/2022 | Adi | ....................... G06F 1/3275 |
| 2023/0178122 | A1 | 6/2023 | Jain | |
| 2025/0246214 | A1* | 7/2025 | Chen | .................... G11C 11/417 |

OTHER PUBLICATIONS

Issue Fee & Rule 312 Amendment, U.S. Appl. No. 18/427,637, filed Nov. 7, 2025, 14 pages.

\* cited by examiner

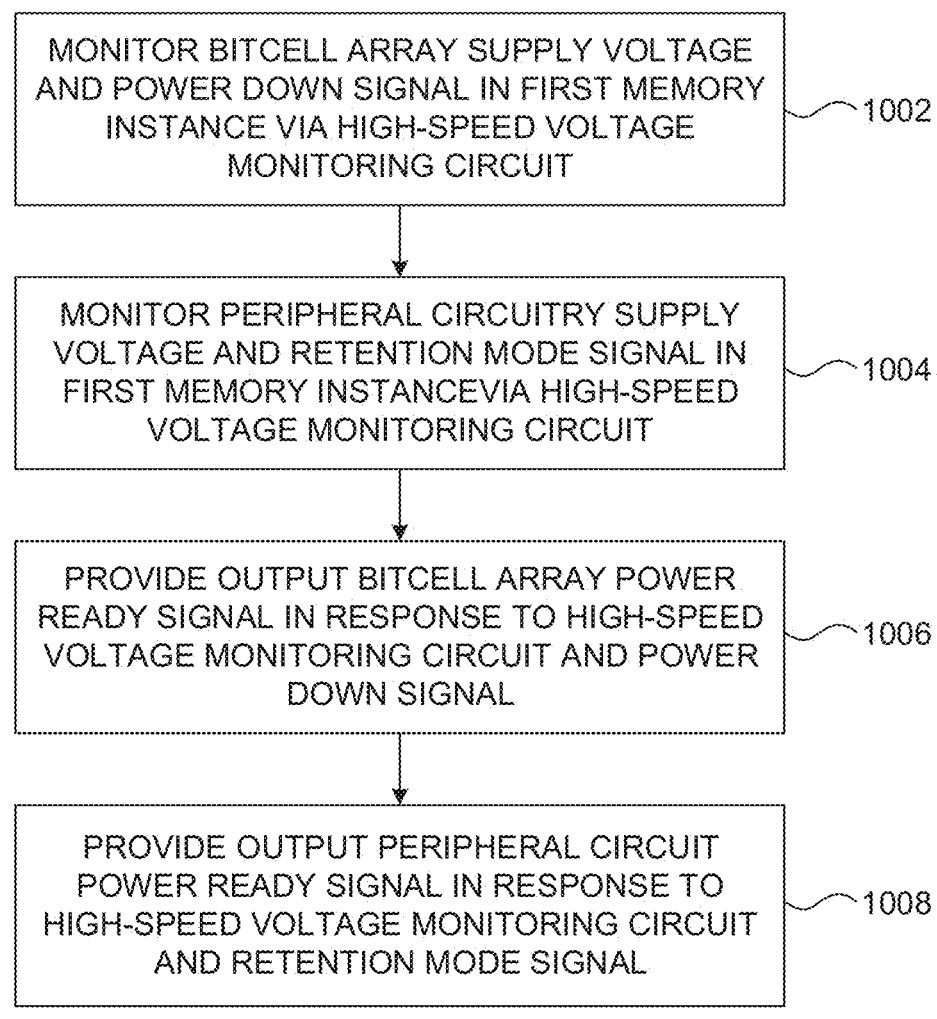

MONITOR BITCELL ARRAY SUPPLY VOLTAGE AND POWER DOWN SIGNAL IN FIRST MEMORY INSTANCE VIA HIGH-SPEED VOLTAGE MONITORING CIRCUIT ~1002

MONITOR PERIPHERAL CIRCUITRY SUPPLY VOLTAGE AND RETENTION MODE SIGNAL IN FIRST MEMORY INSTANCEVIA HIGH-SPEED VOLTAGE MONITORING CIRCUIT ~1004

PROVIDE OUTPUT BITCELL ARRAY POWER READY SIGNAL IN RESPONSE TO HIGH-SPEED VOLTAGE MONITORING CIRCUIT AND POWER DOWN SIGNAL ~1006

PROVIDE OUTPUT PERIPHERAL CIRCUIT POWER READY SIGNAL IN RESPONSE TO HIGH-SPEED VOLTAGE MONITORING CIRCUIT AND RETENTION MODE SIGNAL ~1008

FIG. 10

RAPID POWER READY SIGNALING IN A MEMORY ARRAY

FIELD

The field relates generally to power management in a memory, and more specifically to rapid power ready signaling in a memory array.

BACKGROUND

Computers store information in a variety of ways, including magnetic disk storage that has high capacity and retains its data after power is no longer supplied, nonvolatile semiconductor memory such as flash memory that similarly retains its state when power is disconnected, and volatile memory such as Static Random Access Memory (SRAM) and Dynamic Random Access Memory (DRAM) that operate more quickly but that do not retain their data states when power is removed. SRAM uses semiconductor devices such as transistors to store data, while DRAM typically uses a small capacitor to store data state and must be "refreshed" or rewritten every few seconds or it may lose its data state. Although SRAM bitcell structures are typically larger than DRAM bitcell structures, they operate faster and are therefore preferred for applications such as cache and for internal registers of a CPU. Slower but cheaper DRAM is commonly used for a computer's main memory, where capacity is the primary concern.

SRAM typically comprises a bitcell array of memory cell or bitcell structures that are each operable to store a bit (e.g., a one or zero value) of information, along with peripheral circuitry such as address decoders and circuitry operable to write or erase the contents of bitcells in the bitcell array. In some examples, the bitcell memory cell structures may be addressable via peripheral circuitry as words, where each word comprises a number of bits such as eight bits, 16 bits, 32, bits, or 64 bits that represent a single unit of data that is handled by the processor. A typical modern processor may have a number of registers used during execution of program instructions to store instruction operands and results, each of which may be formed using SRAM or a similar memory structure.

Similarly, frequently-used data may be stored in a cache local to the processor, which may typically contain tens of thousands or hundreds of thousands (or more) of words of data per core in the processor. Local cache made of SRAM bitcell arrays makes retrieval of this often-used data faster than if the same data was retrieved from main memory (or DRAM), which is typically slower and not stored local to the processor. Because SRAM registers, cache, and the like may often be integrated onto the processor die along with processor cores, graphics processors, and the like, they may take up a significant percentage of the processor die area, transistor count, and power consumed by the integrated device. When a processor is powered on, these large bitcell arrays of cache memory may contribute significantly to power inrush as the bitcell arrays and control circuitry draw current to enter a powered-on or ready state.

Some memory arrays therefore seek to power up different banks or instances of memory in the array sequentially, such that the memory instances are staggered or delayed in powering on to manage power inrush. But, such intentional delays may also increase access time for memory that is powered off, reducing the performance of the memory array.

For reasons such as these, improved power management in memory arrays may be desired.

BRIEF DESCRIPTION OF THE DRAWINGS

The claims provided in this application are not limited by the examples provided in the specification or drawings, but their organization and/or method of operation, together with features, and/or advantages may be best understood by reference to the examples provided in the following detailed description and in the drawings, in which:

FIG. 10 is a flow diagram of a method of providing a power status of a memory instance, consistent with an example embodiment.

Figure 1:
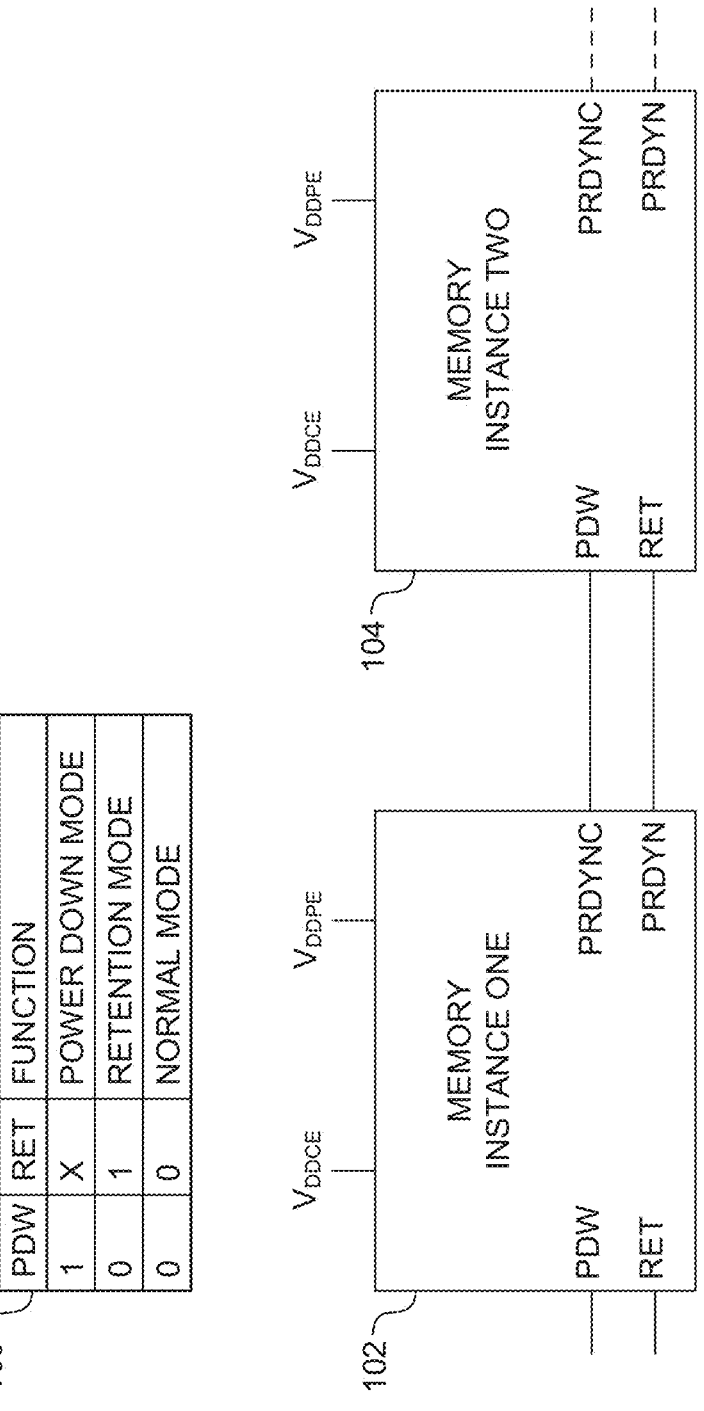
FIG. 1 is a block diagram of sequentially coupled memory instances incorporating internal delays to reduce inrush current, consistent with an example embodiment.

Reference is made in the following detailed description to accompanying drawings, which form a part hereof, wherein like numerals may designate like parts throughout that are corresponding and/or analogous. The figures have not necessarily been drawn to scale, such as for simplicity and/or clarity of illustration. For example, dimensions of some aspects may be exaggerated relative to others. Other embodiments may be utilized, and structural and/or other changes may be made without departing from what is claimed. Directions and/or references, for example, such as up, down, top, bottom, and so on, may be used to facilitate discussion of drawings and are not intended to restrict application of claimed subject matter. The following detailed description therefore does not limit the claimed subject matter and/or equivalents.

DETAILED DESCRIPTION

In the following detailed description of example embodiments, reference is made to specific example embodiments by way of drawings and illustrations. These examples are described in sufficient detail to enable those skilled in the art to practice what is described, and serve to illustrate how elements of these examples may be applied to various purposes or embodiments. Other embodiments exist, and logical, mechanical, electrical, and other changes may be made.

Features or limitations of various embodiments described herein, however important to the example embodiments in which they are incorporated, do not limit other embodiments, and any reference to the elements, operation, and application of the examples serve only to aid in understanding these example embodiments. Features or elements shown in various examples described herein can be combined in ways other than shown in the examples, and any such combinations is explicitly contemplated to be within the scope of the examples presented here. The following detailed description does not, therefore, limit the scope of what is claimed.

Data storage in computerized systems typically includes nonvolatile storage such as magnetic disk storage or flash memory that retains data such as an operating system, installed programs, saved files, and the like when a computer is powered off as well as volatile memory that loses its contents when power is removed. Volatile memory is typically much faster at reading and writing data, and so is used to hold certain operating system components, executing programs, and other data being actively used while a computer is powered on.

Common types of memory employed in computer systems include main memory that is often comprised of Dynamic Random Access Memory (DRAM), and cache memory and registers that are often comprised of Static Random Access Memory (SRAM). DRAM is generally imparts an access latency higher than that of SRAM, but takes fewer components to build per memory cell. DRAM may store a memory state in a capacitive structure to be refreshed on the order of every few seconds to maintain its contents. SRAM may use a larger structure comprising several transistors such as Metal Oxide Semiconductor Field Effect Transistors (MOSFETs) to store data, but may operate with a lower access latency than that of DRAM and so may be preferred for applications where execution speed is more important than capacity such as in cache memory or processor registers.

Memory such as SRAM or DRAM may be built from semiconductors such as on an integrated circuit substrate as an array of bitcells that can each store a single bit of information (typically represented by a one or a zero state). Bitcells may be addressable for reading or writing via peripheral circuitry that accesses the desired bitcells using a combination of bitlines and wordlines, and includes the ability to read from and/or write to addressed bitcells. Bitcells are often addressed by words rather than by individual bitcell addresses, where each word comprises a number of bits (typically a power of two ranging from eight to 64) that make up a base unit of data handled by the processor. A modern 64-bit processor may therefore primarily work with 64-bit words (or may address bitcells 64 bits at a time), but in various examples may also perform single-bit operations or work with other word sizes as well for certain operations. A processor may also have multiple registers for use during execution of software instructions to hold data such as the operands and results being used for each instruction, typically on the order of tens of registers per processor core.

While a relatively slower DRAM may be desirable for main memory of a computer where capacity may be a greater concern than access latency, SRAM may be more applicable for use in processor registers and for cache memory located near the processor core (and often on the same die or substrate as the processor cores) where access latency is of greater concern. Cache memory may store data that is also stored in main memory, but because cache may comprise lower latency SRAM bitcells and may be small in size relative to main memory, cache may provide for faster processor access to data the processor is likely to use soon. A computing device may have multiple levels of cache (e.g., L1, L2, L3, etc.), because smaller caches have lower latency or higher speed but are less likely to contain the desired data than a larger cache. While SRAM may be used for cache memory, some processors, Multi-Chip Modules (MCMs), or Application-Specific Integrated Circuits (ASICs) may also use eDRAM, which is DRAM integrated on the same die or MCM as the processor or ASIC.

Processors may consume many tens or even hundreds of watts while powered up and operational, and the current to power on the processor may significantly exceed the peak current observed during normal operation due to setting initial states of all the processing circuitry and memory such as SRAM cache also located on the processor die. Similarly, powering up relatively large arrays of DRAM may result in significant current inrush due to the large number of DRAM bitcells that are powered on to start the computer. Because components such as DRAM, processors incorporating large banks of SRAM cache, and graphics processors having large banks of memory may be powered up at the same time a computer is powered up, the amount of inrush current drawn can be significant, and may heavily tax the current capabilities of power supply components in the computer.

Some memory arrays may stagger or delay powering up at least some memory instances within the memory array, reducing the peak inrush current experienced when powering up the memory array. Using such delays between memory instances within a memory array can provide a preset delay between each bank before outputting a power ready signal, resulting in predictable delay between powering up each memory bank and ensuring that each memory bank is completely powered up before a power ready signal indicates it is ready for operation. But, using such power ready signals based on worst-case delays plus a margin of safety may introduce unnecessary delay in making each memory bank available for operation, especially when several memory banks are sequentially linked or daisy-chained and dependent on a power-ready signal from the prior bank to start powering on.

Some examples presented herein therefore provide for improved rapid power ready signaling in memory banks, such as by monitoring the power state of the memory bank and providing a power ready signal as soon as the memory bank is powered on and ready for operation. In one such example, a first memory bank or memory instance may include one or more first bitcell arrays, one or more peripheral circuits, and a high-speed voltage monitoring circuit operable to monitor a supply voltage and a power down signal in the first memory instance. The high-speed voltage monitoring circuit may be further operable to provide an output power ready signal derived from the supply voltage and the power down signal such that the output power ready signal indicates when the power down signal is low and the supply voltage is high.

In a further example, the high-speed voltage monitoring circuit may include a first NMOS transistor having a source coupled to ground and a gate and a drain coupled to a first circuit node. A first PMOS transistor may have a drain coupled to the supply voltage and a gate and a source coupled to a second node. A second NMOS transistor may have a source coupled to ground, a gate coupled to the second node, and a drain coupled to first node. A second PMOS transistor may have a drain coupled to the supply voltage, a gate coupled to the first node, and a source coupled to the second node. A third PMOS transistor may have a drain coupled to the supply voltage, a gate coupled to the first node, and a source coupled to an output of the high-speed voltage monitoring circuit. In some examples, the output of the high-speed voltage monitoring is coupled to a first input of an AND gate and the power down signal is inverted and coupled to a second input of the AND gate to provide a output power ready signal.

The high-speed voltage monitoring circuit may be operable to monitor a bitcell array supply voltage and a bitcell array power down signal, and to provide a bitcell array power ready signal derived from the bitcell array supply voltage and the bitcell array power down signal. A second high-speed voltage monitoring circuit may further be operable to monitor a memory peripheral circuitry supply voltage and a memory peripheral circuitry power down signal, and to provide a memory peripheral circuitry power ready signal derived from the memory peripheral circuitry supply voltage and the memory peripheral circuitry power down signal.

In one example, a method of indicating a power state in a memory instance includes monitoring a supply voltage and a power down signal in the first memory instance, and providing an output power ready signal derived from the supply voltage and the power down signal such that the output power ready signal indicates when the power down signal is low and the supply voltage is high, the supply voltage determined to be high via a high-speed voltage monitoring circuit.

In another example, circuits or methods such as these may be embodied in an article comprising a non-transitory computer-readable medium to store computer-readable hardware description language code for fabrication of a device. One such device may include a first memory instance comprising one or more first bitcell arrays and one or more peripheral circuits, the first memory instance further comprising a high-speed voltage monitoring circuit operable to monitor a supply voltage and a power down signal in the first memory instance. The high-speed voltage monitoring circuit may be further operable to provide an output power ready signal derived from the supply voltage and the power down signal such that the output power ready signal indicates when the power down signal is low and the supply voltage is high.

FIG. 1 is a block diagram of memory instances that are sequentially coupled to reduce inrush current, consistent with an example embodiment. A first memory instance is shown at 102, and a second memory instance is shown at 104 and is coupled to the first memory instance. While the particular example embodiment shows first memory instance 102 and second memory instance 104 that are interconnected and/or daisy chained, it should be understood that other embodiments may comprise three or more memory instances that are similarly interconnected and/or daisy chained. Each memory instance of FIG. 1 comprises a bitcell array power signal input labeled as PDW, or power down, and a peripheral control circuitry power signal input labeled as RET, or retention power. In a normal operating condition, both the bitcell array power signal PDW and the peripheral control circuitry or retention power signal are low, or a zero value. When a high or "one" value is received on the PDW or power down input terminal of a memory instance, a bitcell array responsively powers down irrespective of whether a bitcell array power source VDDCE is currently supplying power for the bitcell array. Similarly, when a high or one value is received on the peripheral control circuitry power signal input, or RET input, the peripheral control circuitry powers down irrespective of whether a power source $V_{DDPE}$ is supplying power to the peripheral control circuitry.

This power state of the bitcell array and the peripheral control circuitry may therefore be independently controlled using the PDW and RET inputs respectively, selectively applying power supplied via the $V_{DDCE}$ power supply input for the bitcell array and the VDDPE power supply input for the peripheral control circuitry. A table showing the memory instance power states resulting from various input conditions is shown at 106, indicating that when both PDW and RET control signals are zero or low, the memory is in a normal mode of operation. When the PDW input is high, the bitcell array (and in a further example the control circuitry) may be powered down or brought to a power down mode, while if the PDW input is low or zero but the RET input signal is high the memory instance may be brought to a retention mode where at least a portion of the control circuitry is powered down but the bitcell array remains powered to retain its memory state.

First memory instance 102 is connected to power down control signal at its PDW input and a retention mode control signal at its RET input, and is daisy-chained or sequentially linked to second memory instance 104 via delayed bitcell array power ready signal PRDYNC and control circuitry power ready signal PRDYN. In some further examples, the PRDYN signal may also be intentionally delayed within at least one of multiple daisy-chained memory instances. Signal PRDYNC of memory instance 102 is coupled to input terminal PDW of memory instance 104 such that when the bitcell array of memory instance 102 is powered up and ready it signals the bitcell array of memory instance 104 to power up. Similarly, signal PRDYN of memory instance 102 is coupled to retention mode input terminal RET of memory instance 104, such that the control circuitry of memory instance 104 is powered up once it receives a signal from memory instance 102 that its control circuitry is powered up (e.g., no longer in retention mode).

In some examples, a delay may be introduced between receiving a power down control signal at a PDW input terminal and providing a bitcell array power ready signal at a PRDYNC output. Memory instances such as memory instance 102 and 104 may therefore be sequentially connected or daisy-chained and their bitcell arrays may power up sequentially with a delay between powering up the bitcell arrays of each such memory instance. By delaying startup of bitcell arrays in sequentially-coupled memory instances, the inrush current needed to power up the bitcell arrays may be reduced, such as by configuring the intentional delay in providing a power ready signal to reduce inrush current to an acceptable level. Although the example of FIG. 1 shows how memory instances may be powered up sequentially with an intentional delay introduced between instances to manage inrush current, some embodiments may further incorporate delays between powering up bitcell arrays within a memory instance itself.

Figure 2:
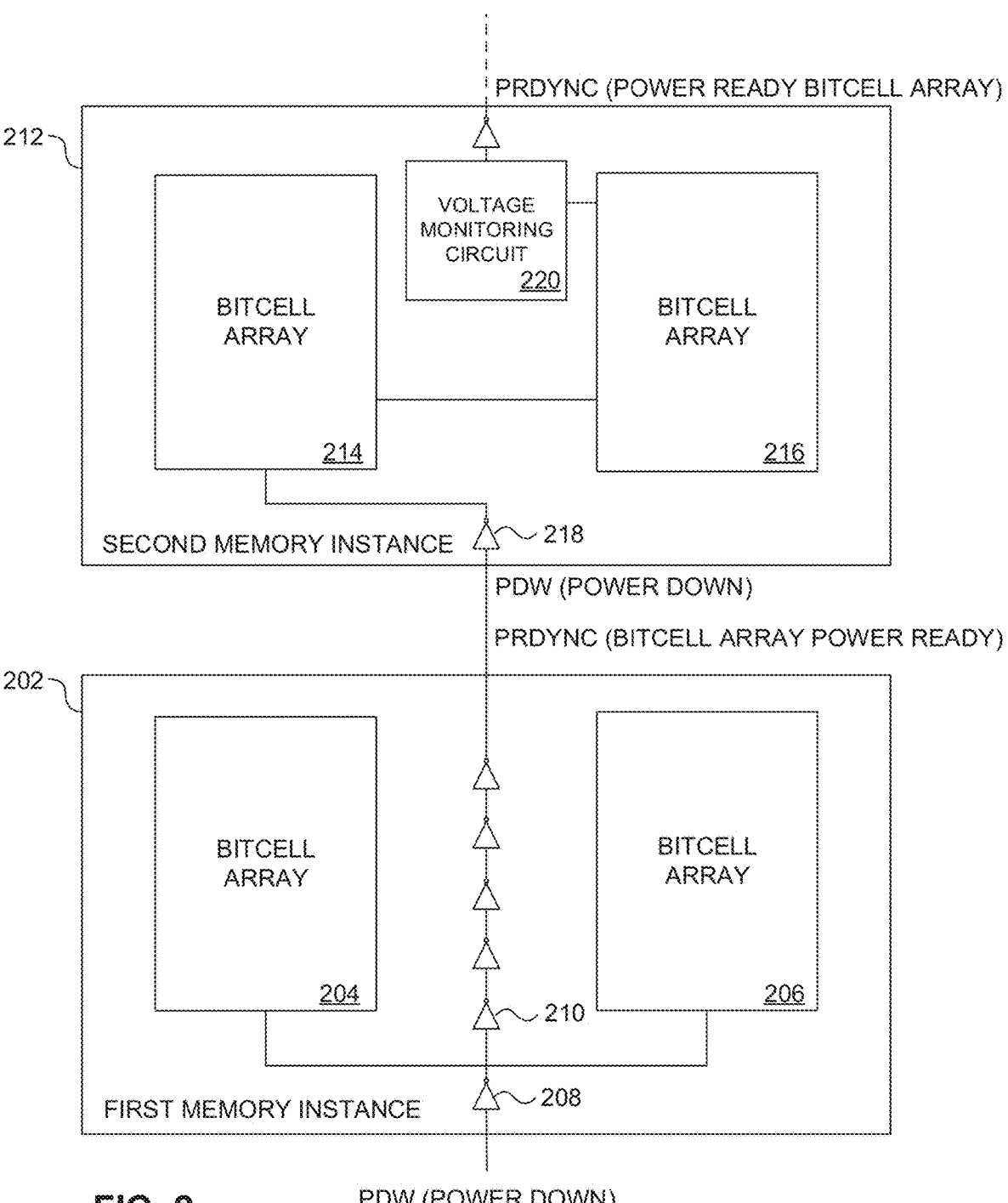
FIG. 2 is a block diagram of memory instances incorporating delay in powering up bitcells within each memory instance, consistent with an example embodiment.

FIG. 2 is a block diagram of memory instances incorporating delay in powering up memory instances, consistent with an example embodiment. Here, a power down signal may be provided to input PDW of a first memory instance, shown at 202. The simplified first memory instance 202 in this example has two bitcell arrays, 204 and 206, and the received power down signal is inverted by inverter 208 before being distributed to the bitcell arrays via wire traces having a length and/or other characteristics configured to introduce an impedance delay, such as a resistance-capacitance delay or RC delay. The wire traces distributing the inverted power down signal to the bitcell arrays are coupled to inverters 210, which invert the signal multiple times to incorporate delay before providing it as a bitcell array power ready output from memory instance one.

The inverters 208 and 210 may introduce delay to the received power down signal before providing it as an output at the first memory instance's bitcell array power ready output, and the wire between the power down input (PDW) and the power ready output (PRDYNC) may act as a delay wire having a delay based on its designed RC characteristics. An RC delay of the delay wire trace not only introduces additional delay between the received power down signal and the bitcell array power ready output, but in a further example may also provide delay in powering up various bitcells within the bitcell arrays 204 and 206 (such as where different portions of the bitcell array are coupled to different portions of the delay wire). The first memory instance 202 of FIG. 2 therefore may impart delay in powering up bitcells both within the memory instance and between the input and output of the memory instance.

First memory instance 202 is here coupled to a second memory instance 212, similar to what is shown in FIG. 1, with a bitcell array power ready output signal of second memory instance 202 coupled to a power down input of second memory instance to sequentially power up the memory instances reducing inrush current throughout linked memory instances. Second memory instance 212 here comprises an inverter 218 coupled to bitcell arrays 214 and 216 by a wire having an RC delay, much as in first memory instance 202. In the second memory instance 212, the bitcell arrays 214 and 216 are configured to power up bitcell array 214 before powering up bitcell array 216, thereby further reducing inrush current in powering up the bitcell arrays in the second memory instance and introducing additional RC delay in the longer delay wire path.

The power ready signal (PRDYNC) provided as an output from the memory instances 202 and 212 indicates both that the next sequential memory instance can be powered up in a staggered or delayed manner to avoid excessive inrush current, and that each respective memory instance is fully powered up and ready to be used. The delay incorporated in the first memory instance 202 by inverters, wire line RC delays, and the like may therefore be configured such that the time delay reflects a worst-case scenario for the last bitcells in the memory bank to be powered plus an adequate margin of safety to ensure proper operation. This conservative approach to power ready signal timing may work well for avoiding power inrush when power on time is not at a premium, but may introduce unnecessary delay when there is an immediate need to access the memory instance such as to store or retrieve data.

The second memory instance therefore may not incorporate delays via inverters, wire line RC delay, and the like sufficient to account for powering on all bitcells in the memory instance plus a margin of safety, but instead may monitor the power state of the memory instance and provide an indication when the power state is sufficient for the memory instance to be operable. In a more detailed example, the power state may be monitored via a high-speed voltage monitoring circuit 220. In a further example, the voltage monitoring circuit may be configured to monitor voltage at a part of the memory known to be the last to power on, such as at the end of a physical section of a memory bank opposite or most remote from a power connection or signal. By employing a voltage monitoring circuit, the power ready signal may be provided as an output of the second memory instance 212 more quickly than a preconfigured delay designed to account for a worst-case delay plus a margin of safety as is incorporated in the first memory instance 202.

Figure 3:
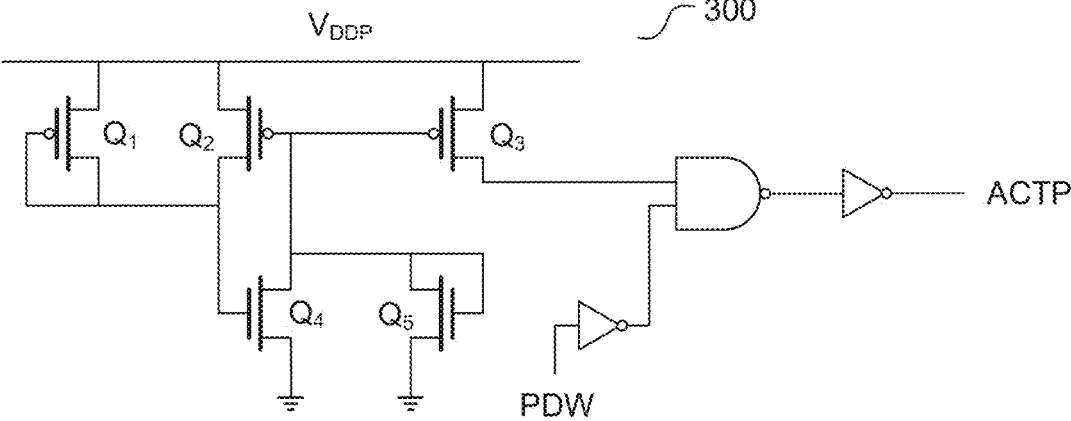
FIG. 3 is a circuit diagram of a high speed voltage monitoring circuit, consistent with an example embodiment.

FIG. 3 is a circuit diagram of a high speed voltage monitoring circuit, consistent with an example embodiment. The circuit generally monitors $V_{DDP}$ for power state, and generates an active power signal (ACTP) in response to an observed power state sufficient for memory operation. The circuit shown in FIG. 3 further monitors the state of a power down signal (PDW), such that if the power down signal is high (i.e. the circuit is being powered down or is in a power down state) the circuit will not output an active power indication irrespective of the monitored $V_{DDP}$ voltage level. High speed voltage monitoring circuits such as that of FIG. 3 may be used in various embodiments to monitor a power state of one or more bitcell arrays in a memory instance, peripheral or control circuitry in a memory instance, or both the power state of a bitcell array and peripheral circuitry in a memory instance.

The circuit shown in FIG. 3 comprises five CMOS transistors $Q_1$-$Q_5$, along with two inverters and a NAND gate coupled to the CMOS transistor circuit output, the power down (PDW) signal input, and the active power signal (ACTP) output. In operation, all transistors $Q_1$-$Q_5$ are off as $V_{DDP}$ starts to rise toward its normal operating voltage and the circuit works to sense the transition to operating voltage being present. Transistors $Q_1$ and $Q_5$ are diode-connected, such that there is always a voltage drop (the amount of voltage drop is dependent on the semiconductor process and transistor structure) across the transistors when sufficient voltage is present for these transistors to power on. NMOS transistor $Q_4$ is then driven to turn on based on the voltage supplied to its gate via diode-connected PMOS transistor $Q_1$. PMOS transistors $Q_2$ and $Q_3$ are then powered on as the voltage at $V_{DDP}$ continues to rise above the voltage at the coupled drains of NMOS transistors $Q_4$ and $Q_5$, causing the source of $Q_3$ to be tied to the high VDDP signal.

The source of $Q_3$ provides the five-transistor voltage sensing circuit's output, which in the example of FIG. 3 is coupled to a NAND gate along with an inverted power down (PDW) signal provided to the memory instance in which the high-speed voltage sensing circuit is connected. A final inverter connected to the NAND gate output provides an active power (ACTP) output, indicating that the monitored voltage $V_{DDP}$ is sufficiently high for normal operation of the memory instance and that the power down (PDW) signal is not high.

Although the circuit of FIG. 3 is configured to monitor $V_{DDP}$, or the on-device voltage for the peripheral or control circuitry for a memory instance, a similar circuit may be used to monitor the on-device voltage $V_{DDC}$ of one or more bitcell arrays as shown at 220 of FIG. 2, providing a power ready bitcell array (PRDYNC) signal as an output. The circuit of FIG. 3 provides several advantages over other methods such as using a predetermined delay with a margin of safety built in or simply using $V_{DDP}$ to directly trigger an NMPS transistor to provide an active power signal, and is faster to indicate an active power state than either such method.

Figure 4:
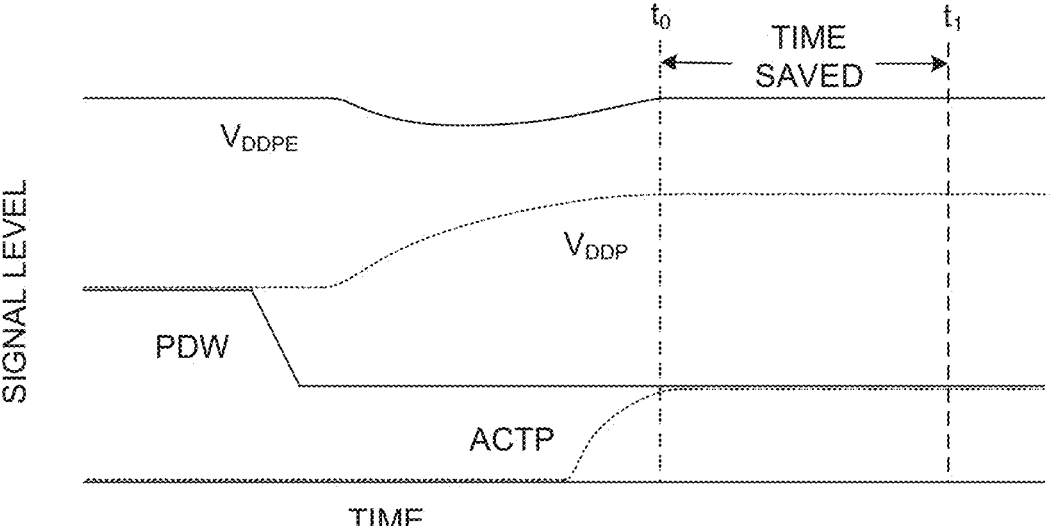
FIG. 4 is a timing diagram showing voltage levels of various signals during power on of a memory instance, consistent with an example embodiment.

FIG. 4 is a timing diagram showing voltage levels of various signals during power on of a memory instance, consistent with an example embodiment. Here, a VDDPE signal provides external power to the memory instance, and dips briefly as a power down signal (PDW) goes from high to low, initiating powering on the peripheral circuitry of the memory instance. The observed voltage in the peripheral circuitry VDDP rises to a normal operating level shortly after the power down signal PDW goes low, and the active power signal output by the circuit of FIG. 3 goes high rapidly as soon as VDDP reaches an operational level.

In prior art memory instances such as first memory instance 202 of FIG. 2, a power ready signal (PRDYN or PRDYNC) would not be provided until the maximum possible time plus a margin of safety for the voltage VDDP to rise to an operational level, represented by $t_1$ in FIG. 4. The high-speed voltage monitoring circuit such as that of FIG. 3 may detect and indicate a power ready or active power condition well in advance of the conservative $t_1$ time estimate, such as at the time to when the ACTP signal is high in FIG. 4, represented by to. The difference between times $t_0$ and $t_1$ therefore represents time saved in waiting for the memory instance to be available for operation, such as writing or reading data. This represents a significant potential improvement over prior art methods of managing operational availability of memory instances such as cache memory where memory instances may be powered up and down during operation of a processor or computerized system.

Figure 5:
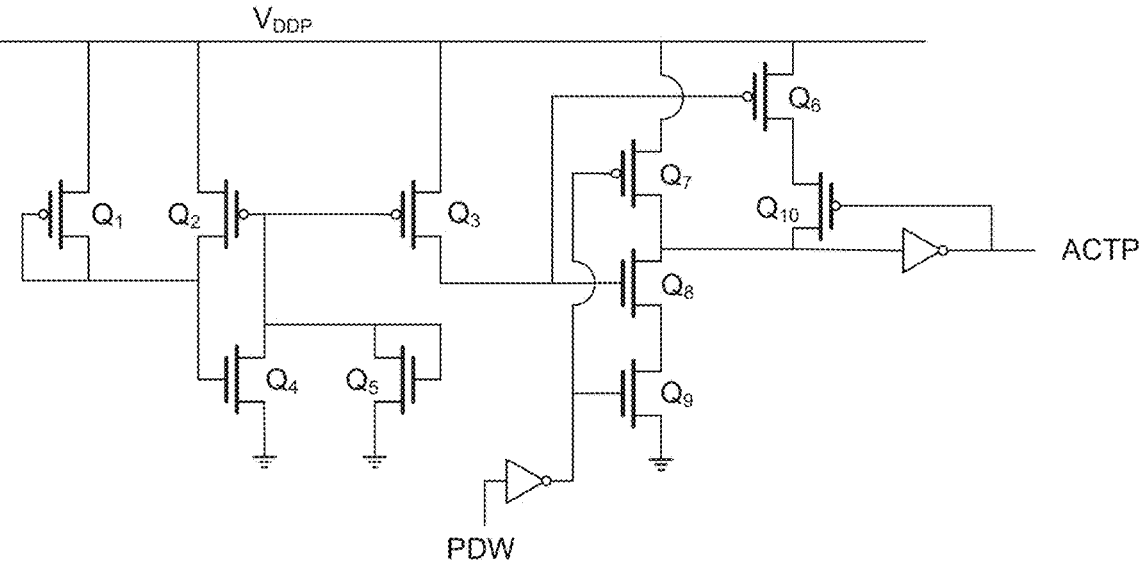
FIG. 5 is a schematic diagram of a high speed voltage monitoring circuit including a NAND gate cutoff, consistent with an example embodiment.

FIG. 5 is a schematic diagram of a high speed voltage monitoring circuit including a NAND gate cutoff, consistent with an example embodiment. Here, transistors $Q_1$-$Q_5$ form a high-speed voltage monitoring circuit, much like the transistors $Q_1$-$Q_5$ of FIG. 4. The output of transistor $Q_3$ is connected to a NAND gate much like the example of FIG. 4, with the NAND gate here formed of transistors $Q_6$-$Q_9$. The NAND gate is additionally coupled to an inverted power down (PDW) signal, such that the active power (ACTP) or power ready signal does not go high if a power down signal is present, irrespective of the voltage level VDDP. The NAND gate in this example further comprises an additional transistor $Q_{10}$ having a gate coupled to the active power signal (ACTP), such that when the active power signal goes high, the transistor $Q_6$ is disconnected from the input to the inverter providing the active power signal. This turns off the direct current path through transistor $Q_6$, reducing leakage current that is no longer needed when the active power signal is in a high state. The circuit of FIG. 5 may therefore be more energy efficient than an equivalent circuit without $Q_{10}$.

In a further example, voltage thresholds of transistors in the circuit of FIG. 5 may be different. In one such example, transistors $Q_8$ and $Q_9$ may have a lower voltage threshold than transistors $Q_6$, $Q_7$, and $Q_{10}$, such as due to different device or process geometry. By making transistors $Q_8$ and $Q_9$ lower voltage threshold devices they may trigger faster than transistors $Q_6$, $Q_7$, and $Q_{10}$ upon a change in power state, while the higher voltage threshold transistors $Q_6$, $Q_7$, and $Q_{10}$ may have less leakage current than transistors $Q_8$ and $Q_9$ when off such as due to their larger geometry.

Figure 6:
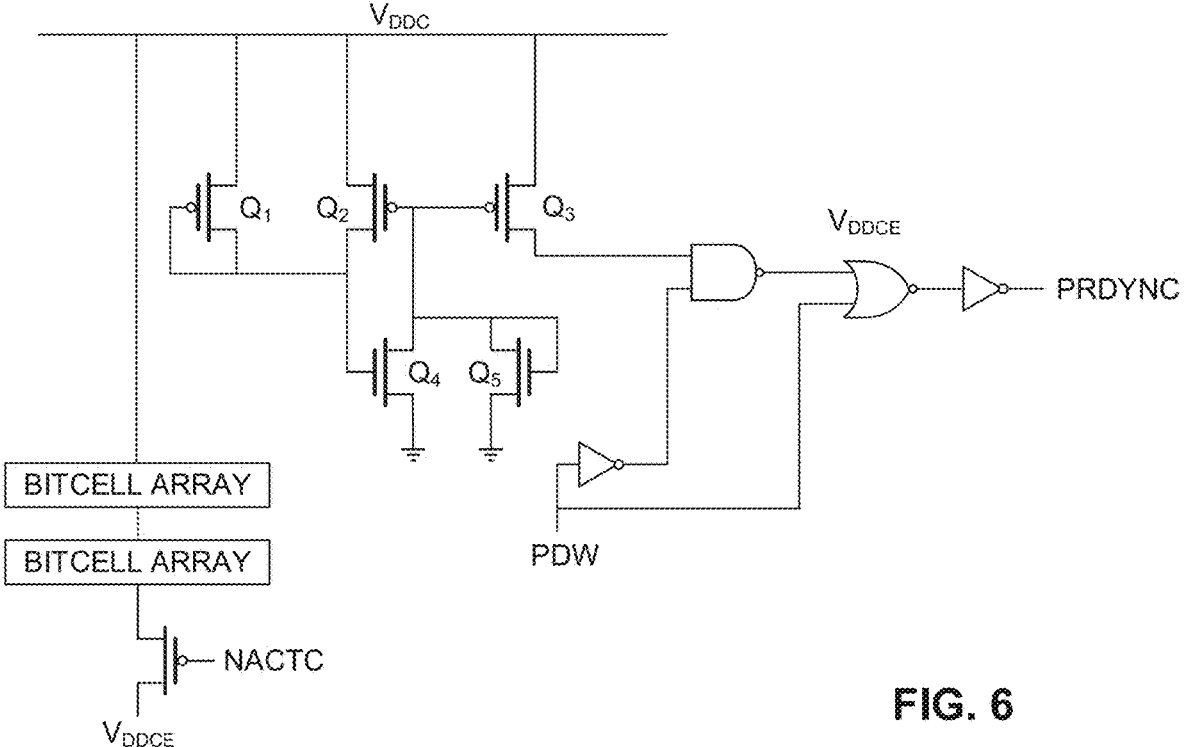
FIG. 6 is a schematic diagram of a high speed voltage monitoring circuit configured to indicate the power state of a bitcell array power signal, consistent with an example embodiment.

FIG. 6 is a schematic diagram of a high speed voltage monitoring circuit configured to indicate the power state of a bitcell array power signal, consistent with an example embodiment. Here, bitcell arrays shown on the left part of the schematic diagram may be selectively provided power via bitcell array power supply signal VDDCE and control signal NACTC, with the state of power in the bitcell arrays $V_{DDC}$ monitored at a point in the bitcell arrays that is likely among the last to receive power upon powering up. Transistors $Q_1$-$Q_5$ form a high-speed voltage monitoring circuit that functions much as the example of FIG. 4, feeding a series of output gates coupled to an inverted power down (PDW) signal to produce a power ready bitcell array signal PRDYNC that is in this example inverted to a low output state to indicate a power ready condition, consistent with the examples of FIGS. 1 and 2.

The inverted power down signal PDW and the output of the high-speed voltage sensing circuit formed here by transistors $Q_1$-$Q_5$ are provided as inputs to a NAND gate, the output of which is coupled to a NOR gate along with the noninverted power down signal PDW. The output of the NOR gate is inverted to generate the power ready bitcell array signal PRDYNC signal, which in a low state indicates that the bitcell arrays pictured on the left are in a power ready condition. In operation, the output gates reset the PRDYNC signal when the PDW signal falls if the $V_{DDC}$ does not fall below a threshold amount, indicating a rapid power ready state. If the $V_{DDC}$ falls below a threshold amount before powering back on, the PRDYNC signal indicates a power ready condition only when the $V_{DDC}$ signal rises above the threshold.

Figure 7:
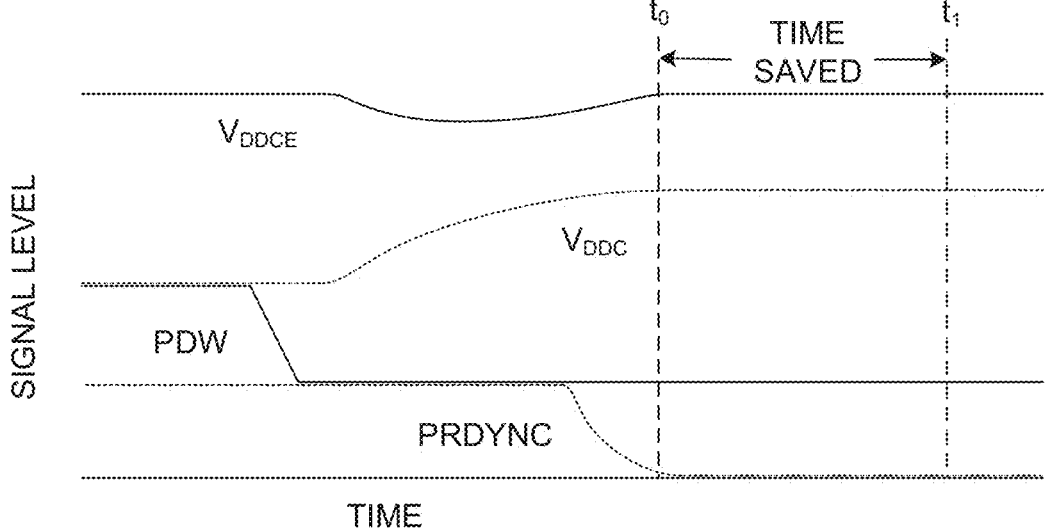
FIG. 7 is a timing diagram showing voltage levels of various signals during power on of bitcell arrays of a memory instance, consistent with an example embodiment.

FIG. 7 is a timing diagram showing voltage levels of various signals during power on of bitcell arrays of a memory instance, consistent with an example embodiment. Here, the supply voltage powering a bitcell array represented as $V_{DDCE}$ dips below a threshold amount after a power down signal PDW is brought low, resulting in a slight delay as the voltage level of $V_{DDCE}$ recovers above the threshold amount before the power ready signal PRDYNC is brought from a high to a low position. This voltage delay is consistent with the delay introduced by the logic gates in the circuit in the example of FIG. 6 in response to the $V_{DDCE}$ and PDW input signals. The low PRDYNC signal indicates that power in the bitcell array or arrays of the memory instance is ready, and may be used to indicate that the memory is ready for use, that other memory arrays can be powered on, and the like. Time savings relative to budgeting for a worst-case scenario is represented by the "time saved" legend reflecting the difference between worst-case time $t_1$ and the time to PRDYNC change at $t_0$.

Figure 8:
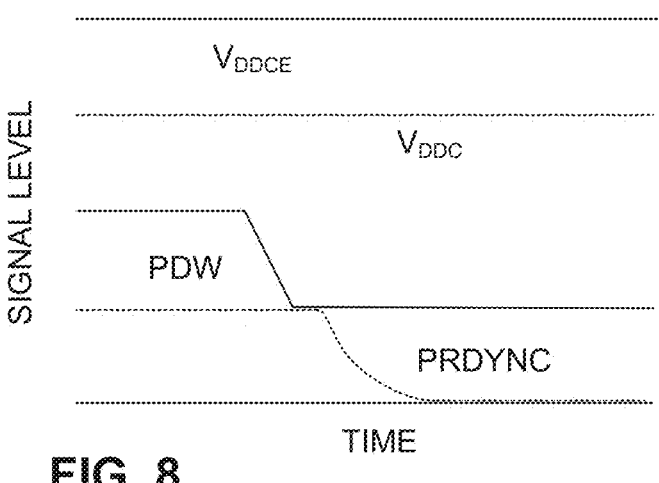
FIG. 8 is a timing diagram showing voltage levels of various signals during power on of bitcell arrays of a memory instance, consistent with an example embodiment.

FIG. 8 is a timing diagram showing voltage levels of various signals during power on of bitcell arrays of a memory instance, consistent with an example embodiment. Here, the supply voltage powering a bitcell array represented as VDDCE does not dip below the threshold amount after a power down signal PDW is brought low, and so the slight delay observed in FIG. 7 as the voltage level of $V_{DDCE}$ recovers above the threshold amount before the power ready signal PRDYNC is brought from a high to a low position is avoided. The low PRDYNC signal therefore indicates that power in the bitcell array or arrays of the memory instance is ready more quickly than in the example of FIG. 7.

Figure 9:
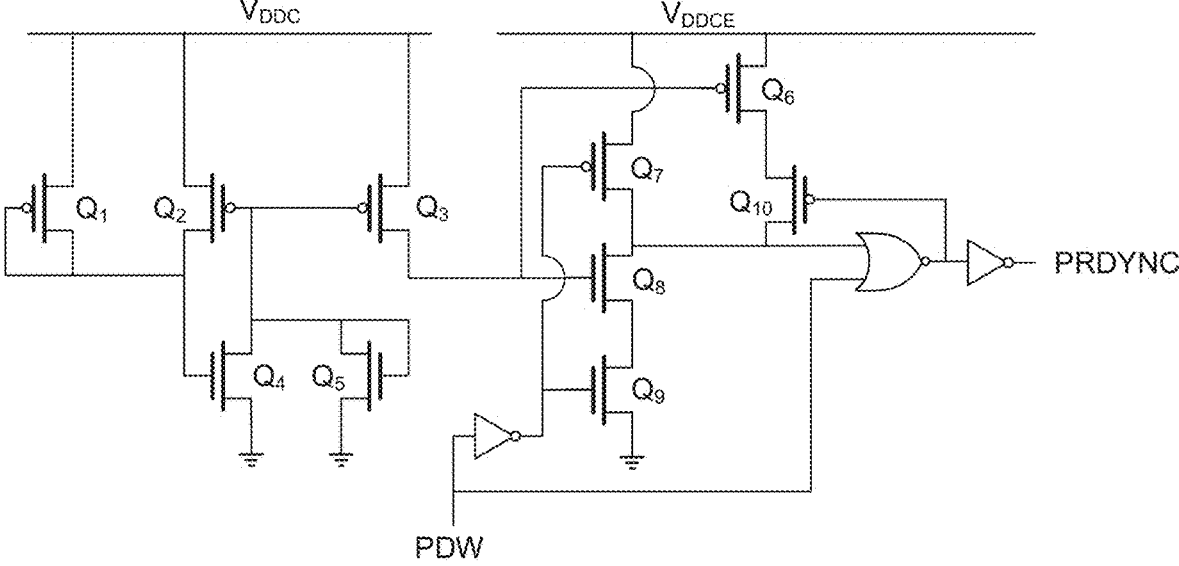
FIG. 9 is a schematic diagram of a high speed voltage monitoring circuit configured to indicate the power state of a bitcell array power signal including a NAND gate cutoff, consistent with an example embodiment.

FIG. 9 is a schematic diagram of a high speed voltage monitoring circuit configured to indicate the power state of a bitcell array power signal including a NAND gate cutoff, consistent with an example embodiment. The example circuit of FIG. 9 is similar to the example of FIG. 6, but with transistors $Q_6$-$Q_{10}$ comprising the NAND gate as is shown in the example of FIG. 5. More specifically, the output of transistor $Q_3$ indicating a detected power level of $V_{DDC}$ is connected to a NAND gate much like the example of FIG. 6, with the NAND gate here formed of transistors $Q_6$-$Q_9$. The NAND gate is also coupled to an inverted power down (PDW) signal, such that the active power (ACTP) or power ready signal does not go high if a power down signal is present, irrespective of the voltage level $V_{DDC}$. The NAND gate in this example further comprises an additional transistor $Q_{10}$ having a gate coupled to an inverted version of the power ready signal PRDYNC, such that when the inverted power ready signal goes high, the transistor $Q_6$ is disconnected from the input to the inverter providing the active power signal. This turns off the direct current path through transistor $Q_6$, reducing leakage current through a transistor that is no longer needed when the active power signal is in a high state. The circuit of FIG. 9 may therefore be more energy efficient than an equivalent circuit without $Q_{10}$.

FIG. 10 is a flow diagram of a method of providing a power status of a memory instance, consistent with an example embodiment. At 1002, a high-speed voltage monitoring circuit, such as the high-speed voltage monitoring circuit examples of FIGS. 4-9, monitors the voltage level of a bitcell array power supply. In some examples, the voltage is monitored at a physical location of the bitcell array known or likely to receive power last, such as at a part of a bitcell array physically distant or opposite from a part of the bitcell array where voltage is supplied to the array. A power down signal may be further monitored in some examples, such that the bitcell array voltage will not trigger a power ready output signal if a power down input signal is present. In a more detailed example, one or more logic gates such as a NAND gate and an inverter are used to process the high-speed voltage monitoring circuit signal and the power down signal to generate an active power or power ready output signal.

Similarly, peripheral circuitry and/or control circuitry power may be monitored at 1004, such as via another high-speed voltage monitoring circuit. A retention mode signal may be further monitored in some examples, such as where the retention mode signal indicates that the peripheral control circuitry may be powered down while the bitcell array is powered on to retain its state.

At 1006, a bitcell array power ready (PRDYNC) signal or active power (ACTP) signal may be provided based on the high-speed voltage monitoring circuit signal and the power down signal, such that the power ready or active power signal is high when the monitored voltage is high and the power down signal is low (or an inverted power down signal is high). The power ready or active power signal may indicate that the bitcell array is ready for operation and/or that the next bitcell array, memory instance, or the like may be powered on in a power on sequence configured to reduce inrush current during startup in various embodiments.

An output power ready signal (PRDYN) for the peripheral and/or control circuitry or active power signal (ACTP) may be provided based on the high-speed voltage monitoring circuit that monitors the state of the peripheral circuitry. In a further example, the output power ready signal may be further based on the state of a retention mode signal, such that if the retention mode signal is high and the control circuitry is in retention mode the output power ready signal will not indicate a power ready state.

The output power ready signals for the bitcell arrays and the peripheral or control circuitry may indicate to circuits external to a memory instance that the memory instance is powered and operational at 1008, and in a further example may be provided to a next memory instance such as a serially-connected or daisy-chained memory instance to trigger powering up the next memory instance to reduce inrush current when powering up multiple memory instances.

Figure 11:
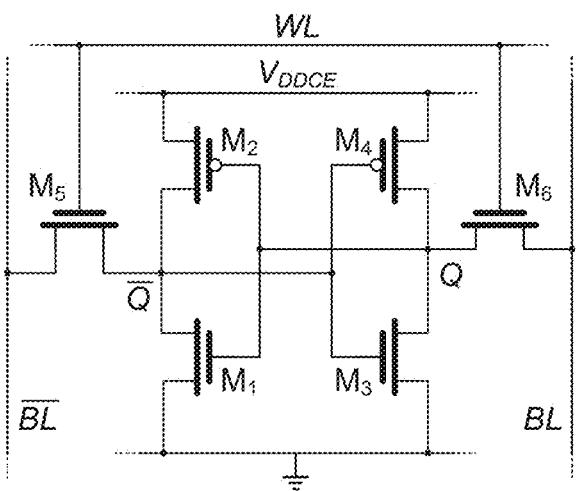
FIG. 11 is a schematic diagram of a static random access memory (SRAM) cell, consistent with an example embodiment.

FIG. 11 is a schematic diagram of a static random access memory (SRAM) cell, consistent with an example embodiment. The SRAM memory cell of FIG. 11 is often referred to as a 6 T SRAM cell due to its six transistors, but other SRAM memory cell configurations exist and may also be used to form bitcell arrays such as those in the examples presented herein.

The memory cell can store a "bit" or single high or low state of information using the four transistors M1, M2, M3, and M4. These four transistors form two cross-coupled inverters, which are stable in either a high or low (i.e., a 1 or 0) state. Access transistors M5 and M6 control access to the cross-coupled inverters formed by M1, M2, M3, and M4 during read and write operations. Word lines denoted by WL and bitlines denoted by BL are used to select which memory bitcells in a bitcell array are being addressed, and use of both a bitline BL and inverse bitline $\overline{BL}$ may improve noise margins and speed of the SRAM bitcell.

In operation, the bitcell may operate in standby, reading, or writing states. In a standby state, the word line WL is not active, the access transistors M5 and M6 disconnect the cell from the bit lines, and the cross-coupled inverters formed by M1, M2, M3, and M4 reinforce each other to retain their state as long as they remain powered.

In a reading state, the word line WL is brought high, and one or both of the bitline BL and inverse bitline $\overline{BL}$ may be read to determine the state of the bitcell. Because the bitlines are often relatively long and have some parasitic capacitance, reading the state of a memory cell is often done by precharging both bitlines BL and $\overline{BL}$ with a one or high value, asserting the word line WL thereby enabling transistors M5 and M6, and observing which bitline voltage drops relative to the other bitline such as by using a comparator or sense amplifier to speed up the read operation.

To write a value to the bitcell the value to be applied is written to the bit lines, such as writing a one value as bringing bitline BL to a one or high state and $\overline{BL}$ to a zero or low state. The word line WL is then asserted, and the value to be stored is latched into the bitcell. In a more detailed example, the bit line inputs are driven with a strong enough voltage signal to overcome the relatively weak transistors in the bitcell such that they can easily override the previous state of the bitcell's cross-coupled inverters. Because the inverters are cross-coupled, a slight change in state to one of the inverters (e.g. transistor pair M1 and M2) will help overwrite the state of the other pair of inverters. Access NMOS transistors M5 and M6 may be further designed to be stronger than the transistors M1, M2, M3, and M4, contributing to the speed of the write process.

Arrays of SRAM may be formed in a two-dimensional grid, with row and column decoders in peripheral circuitry selecting wordlines and bitlines associated with bitcells based on their memory address to access the bitcells. Bitcells are often accessed one word at a time, where a word may comprise a byte (or 8 bits), or another power of two such as 16, 32, or 64 bits. In other examples, memory operations may be conducted on words, single bits, pages of words, or other units of addressable memory to write and store information in the SRAM.

The examples shown here demonstrate how inrush current in a memory such as SRAM cache may be managed by using one or more integrated delay elements such as inverters, RC delay lines, and the like to significantly slow down power down signal propagation between memory instances in a memory array. The delay in some examples may be between memory instances, while in other examples the delay is also introduced between bitcell arrays within a memory instance. Further examples may be configured to delay a power up signal, but to pass a power down signal more quickly through a series of sequentially-linked or daisy-chained memory instances. By staggering or delaying the power up times of interconnected or chained memory instances, inrush current when powering the memory instances on or resuming from an inactive state can be reduced.

Figure 12:
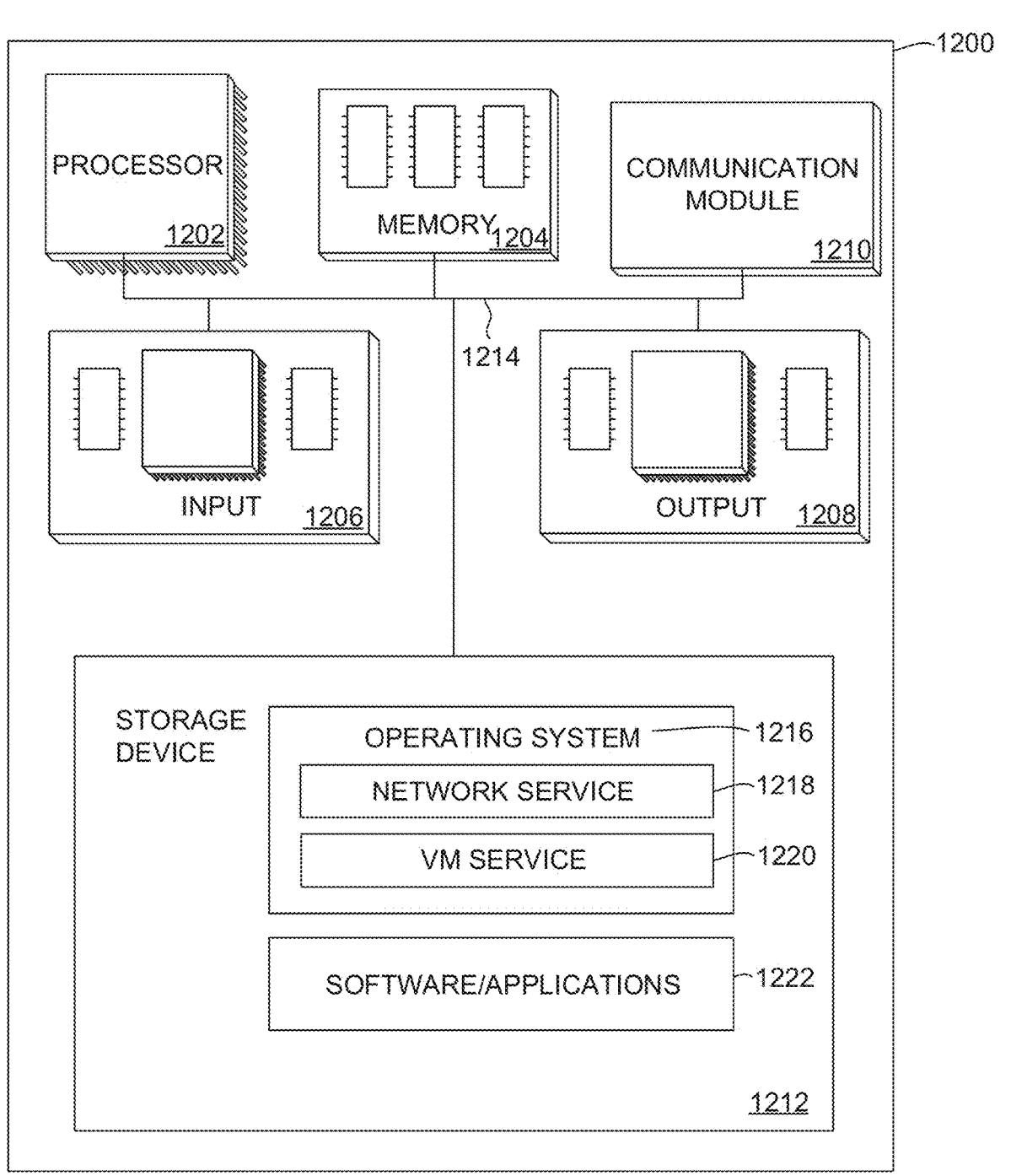
FIG. 12 shows a block diagram of a general-purpose computerized system, consistent with an example embodiment.

FIG. 12 shows a block diagram of a general-purpose computerized system, consistent with an example embodiment. FIG. 8 illustrates only one particular example of computing device 1200, and other computing devices 1200 may be used in other embodiments. Although computing device 1200 is shown as a standalone computing device, computing device 1200 may be any component or system that includes one or more processors or another suitable computing environment for executing software instructions in other examples, and need not include all of the elements shown here.

As shown in the specific example of FIG. 12, computing device 1200 includes one or more processors 1202, memory 1204, one or more input devices 806, one or more output devices 1208, one or more communication modules 1210, and one or more storage devices 1212.

Computing device 1200, in one example, further includes an operating system 1216 executable by computing device 1200. The operating system includes in various examples services such as a network service 1218 and a virtual machine service 1220 such as a virtual server. One or more applications, such as application 1222 are also stored on storage device 1212, and are executable by computing device 1200.

Each of components 1202, 1204, 1206, 1208, 1210, and 1212 may be interconnected (physically, communicatively, and/or operatively) for inter-component communications, such as via one or more communications channels 1214. In some examples, communication channels 1214 include a system bus, network connection, inter-processor communication network, or any other channel for communicating data. Applications such as software application 1222 and operating system 1216 may also communicate information with one another as well as with other components in computing device 1200.

Processors 1202, in one example, are configured to implement functionality and/or process instructions for execution within computing device 1200. For example, processors 1202 may be capable of processing instructions stored in storage device 1212 or memory 1204. Examples of processors 1202 include any one or more of a microprocessor, a controller, a central processing unit (CPU), a graphics processing unit (GPU), a neural processing unit (NPU), an image signal processor (ISP), a digital signal processor (DSP), an application specific integrated circuit (ASIC), a field-programmable gate array (FPGA), or similar discrete or integrated logic circuitry.

One or more storage devices 1212 may be configured to store information within computing device 1200 during operation. Storage device 1212, in some examples, is known as a computer-readable storage medium. In some examples, storage device 1212 comprises temporary memory, meaning that a primary purpose of storage device 1212 is not long-term storage. Storage device 1212 in some examples is a volatile memory, meaning that storage device 1212 does not maintain stored contents when computing device 1200 is turned off. In other examples, data is loaded from storage device 1212 into memory 1204 during operation. Examples of volatile memories include random access memories (RAM), dynamic random access memories (DRAM), static random access memories (SRAM), and other forms of volatile memories known in the art. In some examples, storage device 1212 is used to store program instructions for execution by processors 1202. Storage device 1212 and memory 1204, in various examples, are used by software or applications running on computing device 1200 such as software application 1222 to temporarily store information during program execution.

Storage device 1212, in some examples, includes one or more computer-readable storage media that may be configured to store larger amounts of information than volatile memory. Storage device 1212 may further be configured for long-term storage of information. In some examples, storage devices 1212 include non-volatile storage elements. Examples of such non-volatile storage elements include magnetic hard discs, optical discs, floppy discs, flash memories, or forms of electrically programmable memories (EPROM) or electrically erasable and programmable (EEPROM) memories.

Computing device 1200, in some examples, also includes one or more communication modules 1210. Computing device 1200 in one example uses communication module 1210 to communicate with external devices via one or more networks, such as one or more wireless networks. Communication module 1210 may be a network interface card, such as an Ethernet card, an optical transceiver, a radio frequency transceiver, or any other type of device that can send and/or receive information. Other examples of such network interfaces include Bluetooth, 4G, LTE, or 5G, WiFi radios, and Near-Field Communications (NFC), and Universal Serial Bus (USB). In some examples, computing device 1200 uses communication module 1210 to wirelessly communicate with an external device such as via a public network.

Computing device 1200 also includes in one example one or more input devices 1206. Input device 1206, in some examples, is configured to receive input from a user through tactile, audio, or video input. Examples of input device 1206 include a touchscreen display, a mouse, a keyboard, a voice responsive system, video camera, microphone or any other type of device for detecting input from a user.

One or more output devices 1208 may also be included in computing device 1200. Output device 1208, in some examples, is configured to provide output to a user using tactile, audio, or video stimuli. Output device 1208, in one example, includes a display, a sound card, a video graphics adapter card, or any other type of device for converting a signal into an appropriate form understandable to humans or machines. Additional examples of output device 808 include a speaker, a light-emitting diode (LED) display, a liquid crystal display (LCD or OLED), or any other type of device that can generate output to a user.

Computing device 1200 may include operating system 1216. Operating system 1216, in some examples, controls the operation of components of computing device 1200, and provides an interface from various applications such as software application 1222 to components of computing device 1200. For example, operating system 1216, in one example, facilitates the communication of various applications such as software application 1222 with processors 1202, communication unit 1210, storage device 1212, input device 1206, and output device 1208. Applications such as application 1222 may include program instructions and/or data that are executable by computing device 1200. These and other program instructions or modules may include instructions that cause computing device 1200 to perform one or more of the other operations and actions described in the examples presented herein.

Bitcell arrays, memory structures, memory instances, peripheral circuitry, and other circuits as described herein in particular examples may be formed in whole or in part by and/or expressed in transistors and/or lower metal interconnects (not shown) in processes (e.g., front end-of-line and/or back-end-of-line processes) such as processes to form complementary metal oxide semiconductor (CMOS) circuitry. The various blocks, neural networks, and other elements disclosed herein may be described using computer aided design tools and expressed (or represented), as data and/or instructions embodied in various computer-readable media, in terms of their behavioral, register transfer, logic component, transistor, layout geometries, and/or other characteristics.

Concepts described herein may be embodied in computer-readable code for fabrication of an apparatus that embodies the described concepts. For example, the computer-readable code can be used at one or more stages of a semiconductor design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define a HDL representation of the one or more logic circuits embodying the apparatus in Verilog, System Verilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and System Verilog or other behavioural representations of the concepts that can be interpreted by a computer to enable simulation, functional and/or formal verification, and testing of the concepts.

Additionally or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the invention. Alternatively or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

Features of example computing devices employed in example embodiments may comprise features, for example, of a client computing device and/or a server computing device. The term computing device, in general, whether employed as a client and/or as a server, or otherwise, refers at least to a processor and a memory connected by a communication bus. A "processor" and/or "processing circuit" for example, is understood to connote a specific structure such as a central processing unit (CPU), digital signal processor (DSP), graphics processing unit (GPU), image signal processor (ISP) and/or neural processing unit (NPU), or a combination thereof, of a computing device which may include a control unit and an execution unit. In an aspect, a processor and/or processing circuit may comprise a device that fetches, interprets and executes instructions to process input signals to provide output signals. As such, in the context of the present patent application at least, this is understood to refer to sufficient structure within the meaning of 35 USC § 112 (f) so that it is specifically intended that 35 USC § 112 (f) not be implicated by use of the term "computing device," "processor," "processing unit," "processing circuit" and/or similar terms; however, if it is determined, for some reason not immediately apparent, that the foregoing understanding cannot stand and that 35 USC § 112 (f), therefore, necessarily is implicated by the use of the term "computing device" and/or similar terms, then, it is intended, pursuant to that statutory section, that corresponding structure, material and/or acts for performing one or more functions be understood and be interpreted to be described at least in FIG. 1 and in the text associated with the foregoing figure(s) of the present patent application.

Although specific embodiments have been illustrated and described herein, any arrangement that achieve the same purpose, structure, or function may be substituted for the specific embodiments shown. This application is intended to cover any adaptations or variations of the example embodiments of the invention described herein. These and other embodiments are within the scope of the following claims and their equivalents.

What is claimed is:

1. An apparatus indicating a power state in a memory instance, comprising:
   a first memory instance comprising one or more first bitcell arrays and one or more peripheral circuits, the first memory instance further comprising a high-speed voltage monitoring circuit operable to monitor a supply voltage and a power down signal in the first memory instance, the high-speed voltage monitoring circuit further operable to provide an output power ready signal derived from the supply voltage and the power down signal such that the output power ready signal indicates when the power down signal is low and the supply voltage is high, the high-speed voltage monitoring circuit comprising a first diode-connected circuit operable to provide a first voltage drop between a ground and a power sense circuit and a second diode-connected circuit operable to provide a second voltage drop between the supply voltage and the power sense circuit, the power sense circuit operable to provide an output when a voltage drop is present across the first diode-connected circuit and the second diode-connected circuit.

2. The apparatus of claim 1, wherein the high-speed voltage monitoring circuit comprises:

a first NMOS transistor having a source coupled to ground, and a gate and a drain coupled to a first circuit node;

a first PMOS transistor having a drain coupled to the supply voltage, and a gate and a source coupled to a second circuit node;

a second NMOS transistor having a source coupled to ground, a gate coupled to the second circuit node, and a drain coupled to the first circuit node;

a second PMOS transistor having a drain coupled to the supply voltage, a gate coupled to the first circuit node, and a source coupled to the second circuit node;

a third PMOS transistor having a drain coupled to the supply voltage, a gate coupled to the first circuit node, and a source coupled to an output of the high-speed voltage monitoring circuit.

3. The apparatus of claim 1, wherein the output of the high-speed voltage monitoring circuit is coupled to a first input of an AND gate and the power down signal is inverted and coupled to a second input of the AND gate to provide a output power ready signal.

4. The apparatus of claim 3, wherein the AND gate comprises:

a first PMOS transistor having a gate coupled to the output of the high-speed voltage monitoring circuit, a source coupled to a first circuit node, and a drain coupled to the supply voltage;

a second PMOS transistor having a gate coupled to receive an inverted power down signal, a source coupled to a second circuit node, and a drain coupled to the supply voltage;

a third PMOS transistor having a gate coupled to an AND gate output, a source coupled to the second circuit node, and a drain coupled to the first circuit node;

a first NMOS transistor having a gate coupled to the output of the high-speed voltage monitoring circuit, a source coupled to a third circuit node, and a drain coupled to the second circuit node;

a second NMOS transistor having a gate coupled to receive the inverted power down signal, a source coupled to ground, and a drain coupled to the third circuit node; and an inverter having an input coupled to the second circuit node and an output connected to the AND gate output;

wherein a voltage threshold of the first NMOS transistor, the second NMOS transistor, or a combination thereof, is lower than a voltage threshold of one or more of the first PMOS transistor, the second PMOS transistor, and the third PMOS transistor.

5. The apparatus of claim 1, wherein peripheral circuitry of the first memory instance comprises control circuitry used to control operation of the one or more first bitcell arrays in the first memory instance.

6. An apparatus indicating a power state in a memory instance, comprising:

a first memory instance comprising one or more first bitcell arrays and one or more peripheral circuits, the first memory instance further comprising a high-speed voltage monitoring circuit operable to monitor a supply voltage and a power down signal in the first memory instance, the high-speed voltage monitoring circuit further operable to provide an output power ready signal derived from the supply voltage and the power down signal such that the output power ready signal indicates when the power down signal is low and the supply voltage is high, the first memory instance is to be coupled to a second memory instance by a connection of an output power ready circuit of the first memory instance to a power down input, or to a retention input, or to a combination thereof of the second memory instance to reduce power inrush in bitcell arrays of coupled memory instances.

7. The apparatus of claim 6, wherein the high-speed voltage monitoring circuit is further operable to:

monitor a bitcell array supply voltage and a bitcell array power down signal, and provide a bitcell array power ready signal derived from the bitcell array supply voltage and the bitcell array power down signal; and monitor a memory peripheral circuitry supply voltage and a memory peripheral circuitry power down signal, and provide a memory peripheral circuitry power ready signal derived from the memory peripheral circuitry supply voltage and the memory peripheral circuitry power down signal.

8. The apparatus of claim 6, wherein:

the output power ready signal is derived from the supply voltage and the power down signal such that the output power ready signal indicates when the power down signal is low; and and the supply voltage is determined to be high responsive to a connection of the power down signal and the high-speed voltage monitoring circuit to inputs of an AND gate or a NAND gate.

9. The apparatus of claim 6, wherein peripheral circuitry of the first memory instance comprises control circuitry used to control operation of the one or more first bitcell arrays in the first memory instance.

10. The apparatus of claim 6, wherein an output power ready circuit of the first memory instance is to be coupled to a memory controller to signal that the first memory instance is ready for operation.

11. The apparatus of claim 6, wherein the first memory instance comprises one or more bitcell arrays comprising one or more arrays of static random access memory (SRAM).

12. The apparatus of claim 6, the high-speed voltage monitoring circuit comprising a first diode-connected circuit operable to provide a first voltage drop between a ground and a power sense circuit and a second diode-connected circuit operable to provide a second voltage drop between the supply voltage and the power sense circuit, the power sense circuit operable to provide an output when a voltage drop is present across the first diode-connected circuit and the second diode-connected circuit.

13. A method of indicating a power state in a memory instance, the method comprising:

monitoring a supply voltage and a power down signal in a first memory instance;

providing an output power ready signal derived from the supply voltage and the power down signal such that the output power ready signal indicates when the power down signal is low and the supply voltage is high, the supply voltage determined to be high via a high-speed voltage monitoring circuit;

monitoring a bitcell array supply voltage and a bitcell array power down signal, and providing a bitcell array power ready signal derived from the bitcell array supply voltage and the bitcell array power down signal; and monitoring a memory peripheral circuitry supply voltage and a memory peripheral circuitry power down signal, and providing a memory peripheral circuitry power ready signal derived from the memory peripheral circuitry supply voltage and the memory peripheral circuitry power down signal.

14. The method of claim 13, the high-speed voltage monitoring circuit comprising:

a first NMOS transistor having a source coupled to ground, and a gate and a drain coupled to a first circuit node;

a first PMOS transistor having a drain coupled to the supply voltage, and a gate and a source coupled to a second circuit node;

a second NMOS transistor having a source coupled to ground, a gate coupled to the second circuit node, and a drain coupled to the first circuit node;

a second PMOS transistor having a drain coupled to the supply voltage, a gate coupled to the first circuit node, and a source coupled to the second circuit node;

a third PMOS transistor having a drain coupled to the supply voltage, a gate coupled to the first circuit node, and a source coupled to an output of the high-speed voltage monitoring circuit.

15. The method of claim 13, further comprising providing an output power ready signal by coupling an output of the high-speed voltage monitoring circuit to a first input of an AND gate and inverting and coupling the power down signal to a second input of the AND gate, an output of the AND gate providing the output power ready signal.

16. The method of claim 13, wherein:

the output power ready signal is derived from the supply voltage and the power down signal such that the output power ready signal indicates when the power down signal is low; and and the supply voltage is determined to be high responsive to a connection of the power down signal and the high-speed voltage monitoring circuit to inputs of an AND gate or a NAND gate.

17. The method of claim 13, further comprising coupling the first memory instance to a second memory instance by a connection of an output power ready circuit of the first memory instance to a power down input of the second memory instance to reduce power inrush in bitcell arrays of coupled memory instances.

18. The method of claim 13, further comprising coupling an output power ready circuit of the first memory instance to a memory controller to signal that the first memory instance is ready for operation.

19. The method of claim 13, the high-speed voltage monitoring circuit comprising a first diode-connected circuit operable to provide a first voltage drop between a ground and a power sense circuit and a second diode-connected circuit operable to provide a second voltage drop between the supply voltage and the power sense circuit, the power sense circuit operable to provide an output when a voltage drop is present across the first diode-connected circuit and the second diode-connected circuit.

20. The method of claim 13, further comprising coupling the first memory instance to a second memory instance by a connection of an output power ready circuit of the first memory instance to a retention input of the second memory instance to reduce power inrush in bitcell arrays of coupled memory instances.

* * * * *